United States Patent
Kim

(10) Patent No.: US 12,427,535 B2
(45) Date of Patent: Sep. 30, 2025

(54) METHOD OF MANUFACTURING WINDOW AND DISPLAY DEVICE

(71) Applicant: Samsung Display Co., LTD., Yongin-si (KR)

(72) Inventor: Minki Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/231,183

(22) Filed: Aug. 7, 2023

(65) Prior Publication Data

US 2024/0116069 A1    Apr. 11, 2024

(30) Foreign Application Priority Data

Oct. 7, 2022    (KR) .................. 10-2022-0128392

(51) Int. Cl.
*B05B 12/22*    (2018.01)
*B05D 1/02*    (2006.01)
*B05D 3/00*    (2006.01)
*H04M 1/02*    (2006.01)

(52) U.S. Cl.
CPC .............. *B05B 12/22* (2018.02); *B05D 1/02* (2013.01); *B05D 3/007* (2013.01); *H04M 1/0222* (2013.01); *H04M 1/0268* (2013.01)

(58) Field of Classification Search
None
See application file for complete search history.

(56) References Cited

U.S. PATENT DOCUMENTS

2012/0236477 A1*  9/2012  Weber .................. C03C 21/003
                                                      361/679.01
2018/0217639 A1*  8/2018  Jones .................... G06F 1/1618

FOREIGN PATENT DOCUMENTS

| CN | 113800776 A | * | 12/2021 |
| KR | 101333289 B1 |   | 11/2013 |
| KR | 102111138 B1 | * | 5/2020 |

OTHER PUBLICATIONS

Sun Woog Kim et al., Physical properties of chemically strengthened thin glass prepared by the spray method using an original KNO3-Al2O3 slurry, Materials Chemistry and Physics, vol. 259, Feb. 1, 2021, 123942 pp. 1-28.

* cited by examiner

*Primary Examiner* — David P Turocy
(74) *Attorney, Agent, or Firm* — CANTOR COLBURN LLP

(57) ABSTRACT

A manufacturing method of a window includes: providing a substrate; placing a plurality of masks above the substrate; adjusting positions of the plurality of masks to expose a target area of the substrate; spraying a coating material to the target area of the substrate exposed by the plurality of masks; and heat-treating the substrate and the coating material sprayed on the substrate to form the window.

18 Claims, 11 Drawing Sheets

METHOD OF MANUFACTURING WINDOW AND DISPLAY DEVICE

This application claims priority to Korean Patent Application No. 10-2022-0128392, filed on Oct. 7, 2022, and all the benefits accruing therefrom under 35 U.S.C. § 119, the content of which in its entirety is herein incorporated by reference.

BACKGROUND

1. Field of Disclosure

The present disclosure relates to a method of manufacturing a window and a display device. More particularly, the present disclosure relates to a method of manufacturing a window having surface compressive stress values different for each region and a display device.

2. Description of the Related Art

A display device that provides images to a user, such as a television set, a monitor, a smart phone, and a tablet computer, include a display panel to display the images. As the display panel, various display panels, such as a liquid crystal display panel, an organic light emitting display panel, an electrowetting display panel, and an electrophoretic display panel, are being developed. A window is required to have an impact resistance such as surface hardness or strength and to have a uniform and transparent surface to allow the user to view an input of the user or an output of the display device from the outside.

SUMMARY

The present disclosure provides a method of manufacturing a window having surface compressive stress values different for each region.

The present disclosure provides a display device including the window having surface compressive stress values different for each region.

Embodiments of the invention provide a method of manufacturing a window. The manufacturing method includes: providing a substrate, placing a plurality of masks above the substrate, adjusting positions of the plurality of masks to expose a target area of the substrate, spraying a coating material towards the target area of the substrate exposed by the plurality of masks, and heat-treating the substrate and the coating material sprayed on the substrate to form the window.

The target area may include a first target area and a second target area, and the adjusting of the positions of the plurality of masks may include: adjusting the positions of the plurality of masks to expose a first target area of the substrate and adjusting the positions of the plurality of masks to expose a second target area greater than the first target area of the substrate.

The second target area may include the first target area.

The plurality of masks may include a first mask and a second mask, and the adjusting of the positions of the plurality of masks may include moving the first and second masks such that the first and second masks are away from each other.

A movement distance of the first mask may be equal to a movement distance of the second mask.

The adjusting of the positions of the plurality of masks may include controlling movement speeds of the plurality of masks.

The adjusting of the positions of the plurality of masks may include moving the plurality of masks continuously during the spraying of the coating material.

The plurality of masks may include a first mask and a second mask, and the adjusting of the positions of the plurality of masks may include moving the first and second masks such that the first and second masks get close to each other.

The substrate may include a first non-folding area, a second non-folding area, and a folding area therebetween, and the coating material sprayed to the folding area may have a thickness greater than a thickness of the coating material sprayed to the first and second non-folding areas.

The substrate may be foldable with respect to a folding axis extending in a first direction, and an amount of the sprayed coating material per unit area is reduced as a distance from the folding axis in a second direction perpendicular to the first direction increases.

The forming of the window may include exchanging an ion in the window.

The adjusting of the positions of the plurality of masks may include moving the plurality of masks to cover a contact area of the substrate.

Embodiments of the invention provide a display device including a display module and a window disposed on the display module. The display module and the window are foldable with respect to a folding axis extending in a first direction, and the window has a surface compressive stress value that continuously decreases as a distance from the folding axis in a second direction perpendicular to the first direction increases.

A compressive stress depth of the window is uniform regardless of a position in the window.

Embodiments of the invention provide a method of manufacturing a window. The manufacturing method includes: providing a substrate including a first non-folding area, a second non-folding area and a folding area therebetween, and spraying a coating material to the substrate. The coating material sprayed to the folding area has a thickness greater than a thickness of the coating material sprayed to the first and second non-folding areas.

The method further may include: adjusting positions of a plurality of masks to expose a target area of the substrate, and the adjusting of the positions of the plurality of masks may include adjusting the positions of the plurality of masks to expose a first target area of the substrate and adjusting the positions of the plurality of masks to expose a second target area greater than the first target area of the substrate, wherein the target area may include the first and second target areas.

The plurality of masks may include a first mask and a second mask, and the adjusting of the positions of the plurality of masks may include: moving the first and second masks such that the first and second masks are away from each other.

A movement distance of the first mask may be equal to a movement distance of the second mask.

The adjusting of the positions of the plurality of masks may include controlling movement speeds of the plurality of masks.

The adjusting of the positions of the plurality of masks may include moving the plurality of masks continuously during the spraying of the coating material.

According to the above, as the movement of the first and second masks is controlled, the amount of the coating material per unit area sprayed to the substrate is adjusted, and the surface compressive stress value of the window has continuity. Stains, which are caused by a sudden change in quantity of the coating material, are prevented from occurring, and thus, a visibility of the display device is effectively improved.

According to the above, as the movement speeds of the first and second masks are controlled, the amount of the coating material per unit area sprayed to the substrate is adjusted, and thus, the surface compressive stress value of the window, which is changed depending on the amount of the coating material per unit area, is controlled. For instance, the surface compressive value of the folding area is adjusted to be high. Thus, a folding reliability of the window is effectively improved.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
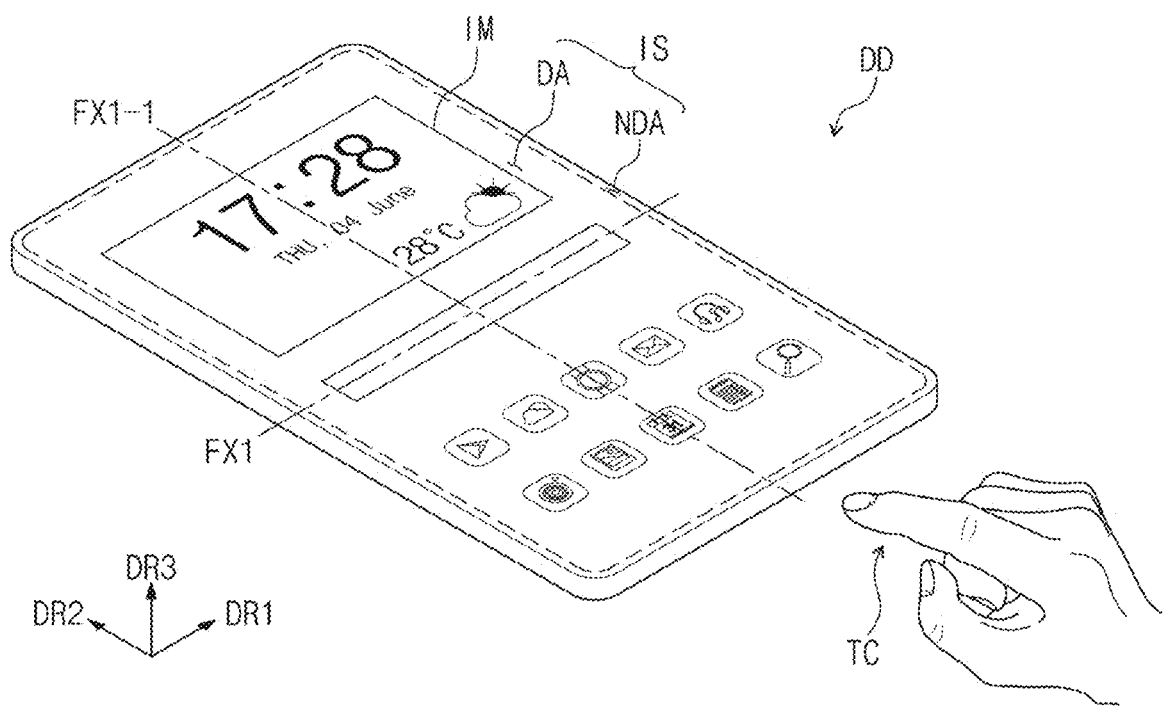
FIG. 1 is a perspective view of a display device according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms "first", "second", etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

FIG. 1 is a perspective view of a display device DD according to an embodiment of the present disclosure.

Referring to FIG. 1, the display device DD may be activated in response to electrical signals. FIGS. 1 to 3B show a smartphone as the display device DD, however, the display device DD should not be limited to the smartphone and may be applied to a variety of electronic devices. As an example, the display device DD may be applied to a large-sized electronic item, such as a television set, a monitor, etc., and a small and medium-sized electronic item, such as a mobile phone, a tablet computer, a car navigation unit, a game unit, etc.

The display device DD may display an image IM on a display surface IS substantially parallel to each of first and second directions DR1 and DR2 toward a third direction DR3. The display surface IS on which the image IM is displayed may correspond to a front surface of the display device DD. The image IM may be a video or a still image. FIG. 1 shows a weather and clock widget and application icons as representative examples of the image IM.

In the present disclosure, front (or upper) and rear (or lower) surfaces of each member of the display device DD may be defined with respect to a direction in which the image IM is displayed. The upper and lower surfaces may be opposite to each other in the third direction DR3, and a normal line direction of each of the upper and lower surfaces may be substantially parallel to the third direction DR3.

A separation distance in the third direction DR3 between the upper and lower surfaces of each member may correspond to a thickness/height in the third direction DR3 of the each member. Meanwhile, directions indicated by the first, second, and third directions DR1, DR2, and DR3 may be relative to each other and may be changed in other directions.

The display device DD may sense a user input TC applied thereto from the outside. The user input TC may include various forms of external inputs. For example, the external inputs may include a proximity input (e.g., a hovering input) applied when approaching close to or adjacent to the display device DD at a predetermined distance as well as a touch input by a user's body part (e.g., a user's hand) or external inputs provided in the form of light, heat, or pressure. In addition, the display device DD may sense the user input TC applied to a side or rear surface of the display device DD depending on a structure of the display device DD, and the present disclosure should not be limited to a particular embodiment.

The display device DD may include short sides extending in the first direction DR1 and long sides extending in the second direction DR2 crossing the first direction DR1. FIG. 1 shows the display device DD having a rectangular shape as a representative example, however, the shape of the display device DD should not be limited to the rectangular shape. According to an embodiment, the display device DD may have a variety of shapes such as a polygonal shape, a circular shape, or an irregular shape.

The display device DD may include the display surface IS. The display surface IS may include a display area DA and a non-display area NDA. The display area DA may be activated in response to electrical signals. The image IM may be displayed on the display area DA, and the external inputs TC may be sensed in the display area DA.

The non-display area NDA may be defined adjacent to the display area DA, and the image IM may not be displayed on the non-display area NDA. The non-display area NDA may have a predetermined color. The non-display area NDA may surround the display area DA. That is, the shape of the display area DA may be defined by the non-display area NDA, however, this is merely an example. According to an embodiment, the non-display area NDA may be defined adjacent to only one side of the display area DA or may be omitted.

The display device DD may be a foldable display device. In detail, a folding axis FX1 or FX1-1 may be defined in the display device DD. The folding axis FX1 or FX1-1 may be a rotational axis that serves as a reference when the display device DD is folded, and the folding axis FX1 or FX1-1 may be formed by components and structures of the display device DD. That is, the display device DD may be folded with respect to the folding axis FX1 or FX1-1. Hereinafter, a state in which the display device DD is folded with respect to the folding axis FX1 or FX1-1 is referred to as a folded state, and a state in which the display device DD is not folded is referred to as a non-folded state. The folding axis FX1 or FX1-1 may be a first folding axis FX1 extending in the first direction DR1 or a second folding axis FX1-1 extending in the second direction DR2. The first folding axis FX1 or the second folding axis FX1-1 will be described in detail later.

Figure 2A:
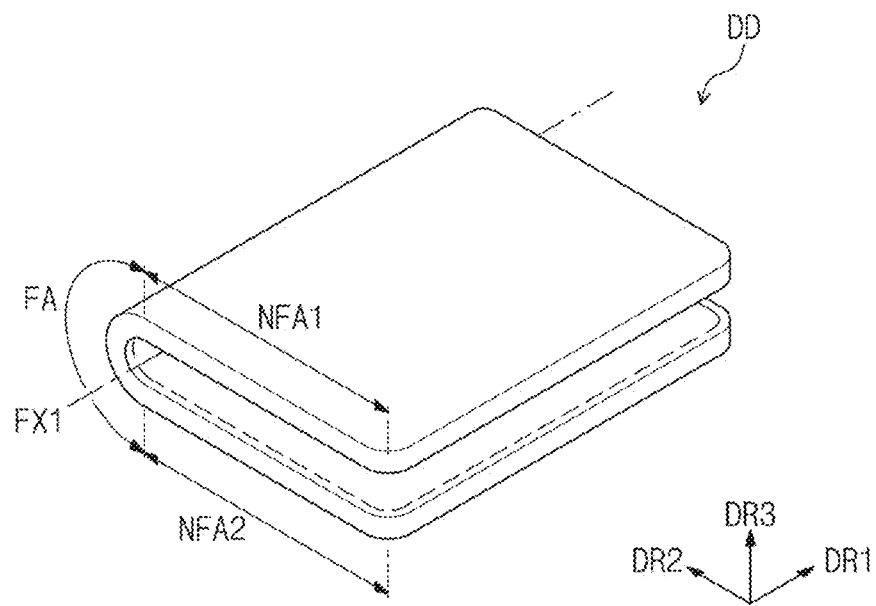
FIGS. 2A and 2B are perspective views of a folded state of a display device according to an embodiment of the present disclosure.
Figure 2B:
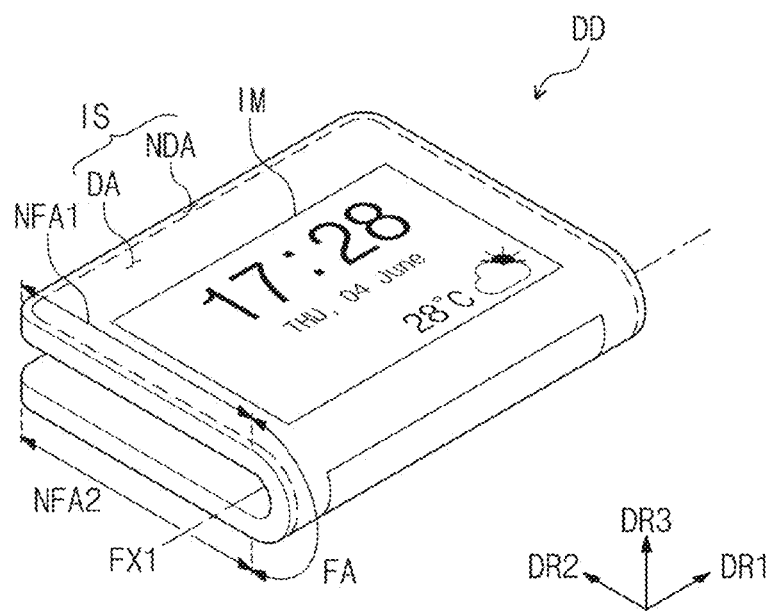

FIGS. 2A and 2B are perspective views of a folded state of the display device DD according to an embodiment of the present disclosure. FIG. 2A is a perspective view showing a state in which the display device DD shown in FIG. 1 is inwardly folded (in-folding) with respect to the first folding axis FX1, and FIG. 2B is a perspective view showing a state in which the display device DD shown in FIG. 1 is outwardly folded (out-folding) with respect to the first folding axis FX1.

Referring to FIGS. 2A and 2B, the display device DD may be folded with respect to the first folding axis FX1. The display device DD may include a first non-folding area NFA1, a folding area FA, and a second non-folding area NFA2. The folding area FA may be defined adjacent to the first non-folding area NFA1, and the second non-folding area NFA2 may be defined adjacent to the folding area FA. That is, the first non-folding area NFA1, the folding area FA, and the second non-folding area NFA2 may be sequentially arranged in a direction opposite to the second direction DR2. The folding area FA may be referred to as a foldable area, and the first and second non-folding areas NFA1 and NFA2 may be referred to as a non-foldable area.

The first non-folding area NFA1 and the second non-folding area NFA2 may not be folded. The folding area FA may be folded with respect to the folding axis FX1 and may have a predetermined curvature and a radius of curvature. In this case, the first folding axis FX1 may extend in a direction substantially parallel to the first direction DR1, i.e., a direction corresponding to the short sides of the display device DD.

The display device DD may be inwardly folded (in-folding) or outwardly folded (out-folding). In the present embodiment, the in-folding indicates a state in which the display surface IS is folded to allow one portion thereof to face the other portion thereof, and the out-folding indicates a state in which the rear surface of the display device DD is folded to allow one portion thereof to face the other portion thereof. In other words, a folded state in which the display device is folded to allow display surfaces of different non-folding areas NFA1 and NFA2 to face each other may be defined as the in-folding, and a folded state in which the display device is folded to allow the display surfaces of different non-folding areas NFA1 and NFA2 to face the outside may be defined as the out-folding.

Referring to FIG. 2A, the display device DD may be inwardly folded (in-folding) to allow the display surface IS of the first non-folding area NFA1 to face the display surface IS of the second non-folding area NFA2. As the first non-folding area NFA1 rotates in a clockwise direction with respect to the first folding axis FX1, the display device DD may be inwardly folded. Although not shown in figures, as the second non-folding area NFA2 rotates in a counter-clockwise direction with respect to the first folding axis FX1, the display device DD may be inwardly folded.

Referring to FIG. 2B, the display device DD may be outwardly folded (out-folding) to allow the display surface of the first non-folding area NFA1 and the display surface of the second non-folding area NFA2 to be exposed to the outside. As the first non-folding area NFA1 rotates in the counter-clockwise direction with respect to the first folding axis FX1, the display device DD may be outwardly folded. Although not shown in figures, as the second non-folding area NFA2 rotates in the clockwise direction with respect to the first folding axis FX1, the display device DD may be outwardly folded.

The image IM may be displayed through the display surface IS of the first non-folding area NFA1 and the display surface IS of the second non-folding area NFA2, which are exposed to the outside. Further, the image IM may also be displayed on the display surface IS of the folding area FA exposed to the outside.

Referring to FIGS. 1 and 2B, the display device DD may display the image IM while being in the non-folded state and may display the image IM while being in the out-folded state. The first non-folding area NFA1, the second non-folding area NFA2, and the folding area FA may display images that provide independent information, respectively, or may display portions of one image that provides one information, respectively.

The display device DD may be manufactured to have both the in-folded state and the out-folded state or may be manufactured to have one of the in-folded and out-folded states.

Figure 3A:
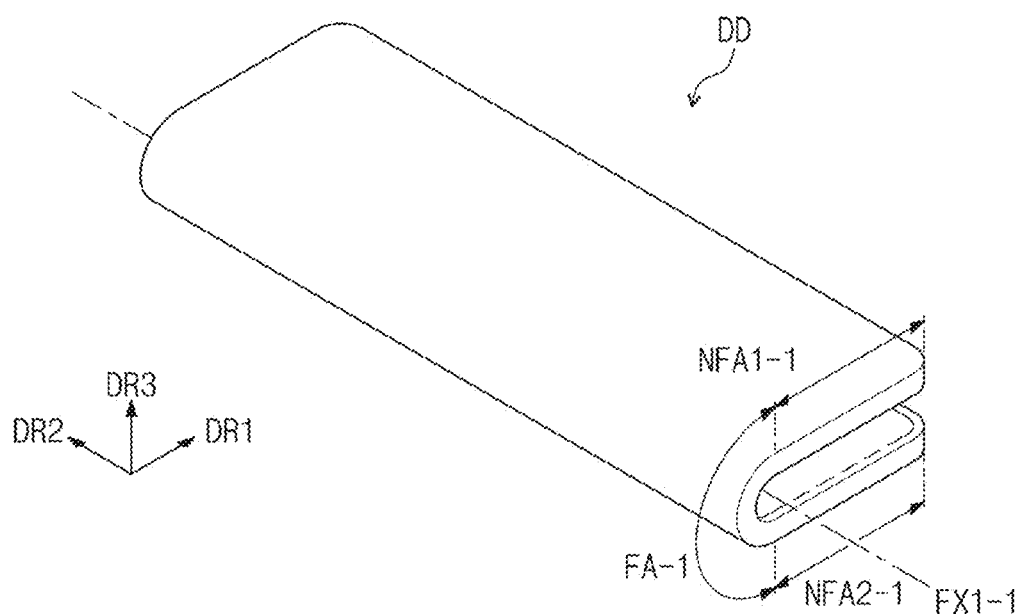
FIGS. 3A and 3B are perspective views of a folded state of a display device according to an embodiment of the present disclosure.
Figure 3B:
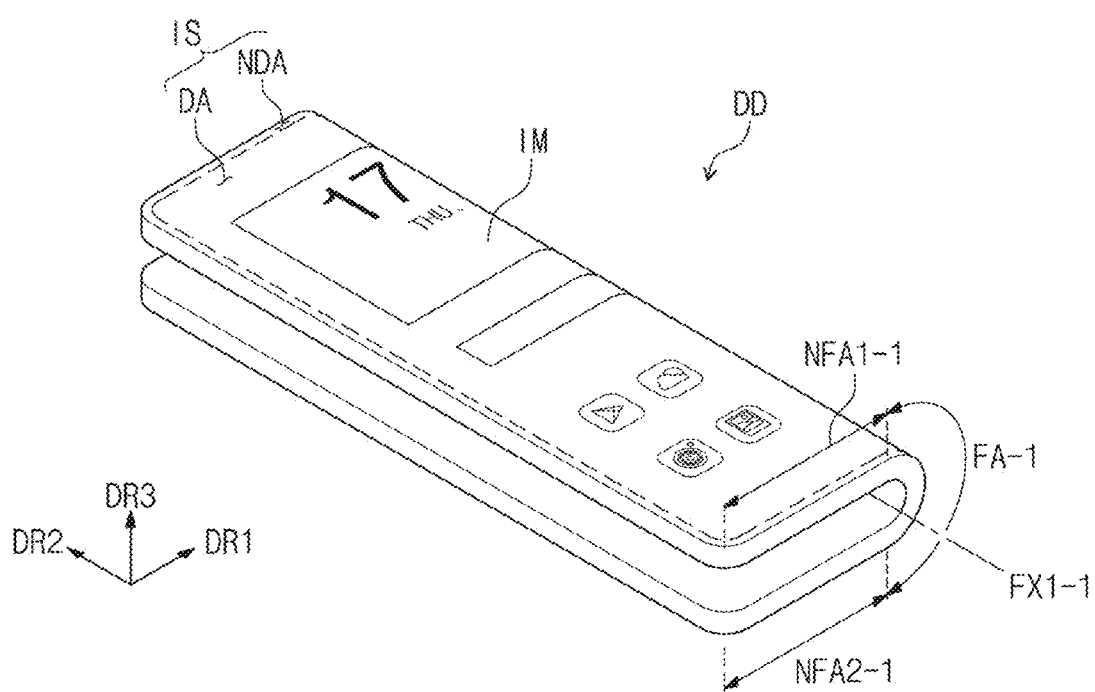

FIGS. 3A and 3B are perspective views of a folded state of the display device DD according to an embodiment of the present disclosure. FIG. 3A is a perspective view showing a state in which the display device DD shown in FIG. 1 is inwardly folded (in-folding) with respect to the second folding axis FX1-1, and FIG. 3B is a perspective view showing a state in which the display device DD shown in FIG. 1 is outwardly folded (out-folding) with respect to the second folding axis FX1-1. In FIGS. 3A and 3B, the same reference numerals denote the same elements in FIGS. 2A and 2B, and thus, detailed descriptions of the same elements will be omitted.

Referring to FIGS. 3A and 3B, the display device DD may be inwardly or outwardly folded with respect to the second folding axis FX1-1. The second folding axis FX1-1 may extend in the second direction DR2, i.e., a major axis direction of the display device DD.

The display device DD may include a first non-folding area NFA1-1, a folding area FA-1, and a second non-folding area NFA2-1. The folding area FA-1 may be defined adjacent to the first non-folding area NFA1-1, and the second non-folding area NFA2-1 may be defined adjacent to the folding area FA-1. That is, the first non-folding area NFA1-1, the folding area FA-1, and the second non-folding area NFA2-1 may be sequentially arranged in the first direction DR1. The folding area FA-1 may be referred to as a foldable area, and the first and second non-folding areas NFA1-1 and NFA2-1 may be referred to as a non-foldable area.

In FIGS. 2A to 3B, one folding area FA or FA-1 is defined in the display device DD, however, the present disclosure should not be limited thereto or thereby. According to an embodiment of the present disclosure, a plurality of folding areas may be defined in the display device DD. In the case where the plural folding areas are defined in the display device DD, each of the folding areas may be inwardly or outwardly folded about a folding axis defined to overlap each of the folding areas.

Figure 4:
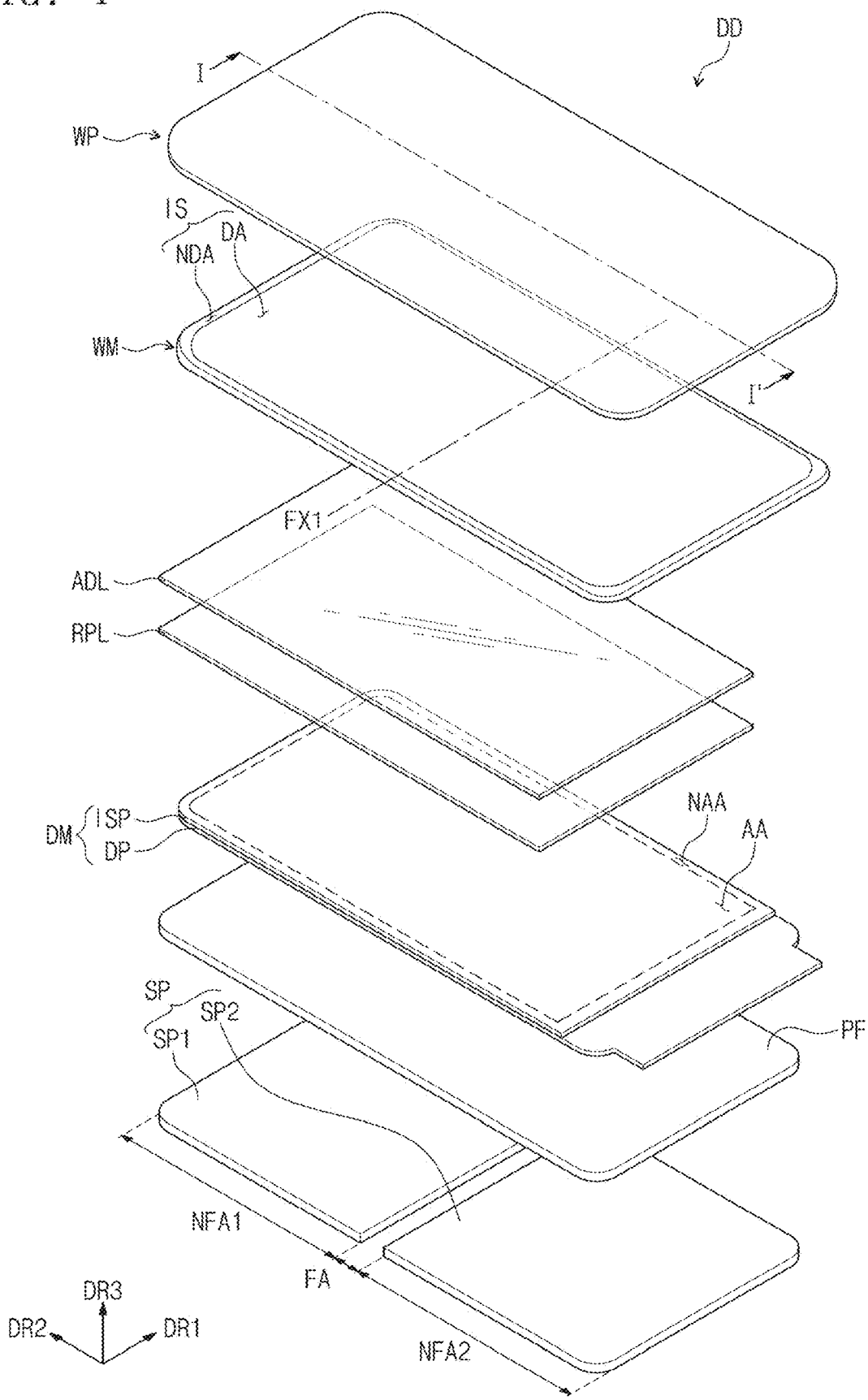
FIG. 4 is an exploded perspective view of a display device according to an embodiment of the present disclosure.
Figure 5:
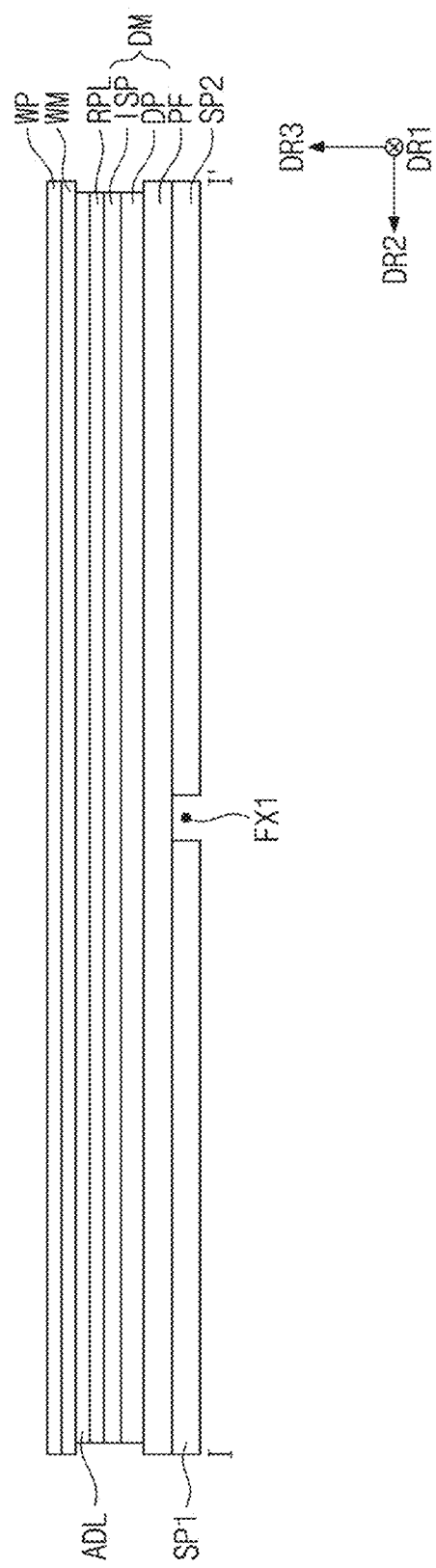
FIG. 5 is a cross-sectional view of a display device according to an embodiment of the present disclosure.

FIG. 4 is an exploded perspective view of the display device DD according to an embodiment of the present disclosure. FIG. 5 is a cross-sectional view of the display device DD according to an embodiment of the present disclosure. FIG. 5 shows a cross-section taken along a line I-I' of FIG. 4.

Referring to FIGS. 4 and 5, the display device DD may include a support plate SP, a protective film PF, a display module DM, an anti-reflective layer RPL, an adhesive layer ADL, a window WM, and a protective member WP.

The support plate SP may be a lower structure of the display device DD and may support the display module DM. The support plate SP may have a strength greater than a strength of the display module DM. As an example, the support plate SP may be a metal plate or a stainless steel plate.

The support plate SP may include a first support plate SP1 corresponding to the first non-folding area NFA1 and a second support plate SP2 corresponding to the second non-folding area NFA2. That is, the first support plate SP1 may be disposed to overlap the first non-folding area NFA1, and the second support plate SP2 may be disposed to overlap the second non-folding area NFA2.

The first and second support plates SP1 and SP2 may be disposed to be spaced apart from each other in the second direction DR2 when the display device is in the non-folded state. An area in which the first and second support plates SP1 and SP2 are spaced apart from each other may correspond to the folding area FA.

The first and second support plates SP1 and SP2 may not overlap the folding area FA in a plan view in the unfolded state. According to an embodiment, the first and second support plates SP1 and SP2 may overlap a portion of the folding area FA and may not overlap the other portion of the folding area FA in a plan view in the unfolded state. That is, a distance between the first and second support plates SP1 and SP2 in the second direction DR2 may be smaller than a width of the folding area FA in the second direction DR2.

The support plate SP may further include a connection module to connect the first and second support plates SP1 and SP2. The connection module may include a hinge module or a multi joint module.

In FIGS. 4 and 5, the support plate SP includes two support plates SP1 and SP2, however, the number of the support plates should not be limited to two. As an example, when the display device DD includes a plurality of folding axes and a plurality of folding areas, the display device DD may include a plurality of support plates separated from each other with respect to the plural folding axes.

In addition, FIGS. 4 and 5 show a structure in which the support plate SP is divided into the first and second support plates SP1 and SP2, however, the present disclosure should not be limited thereto or thereby. That is, the support plate SP may be formed in a single-plate shape to be disposed to correspond to the first and second non-folding areas NFA1 and NFA2 and the folding area FA. In this case, the support plate SP may be provided with a plurality of holes defined therethrough in the folding area FA or may include a material with high flexible property in an area overlapping the folding area FA.

The protective film PF may be disposed between the support plate SP and the display module DM. The protective film PF may serve as a layer that absorbs external impacts applied thereto. According to an embodiment, the protective film PF may be a cushion layer with high porosity. The protective film PF may include a polymer material. The protective film PF may be coupled with each of the display module DM and the support plate SP by an adhesive film (not shown).

The display module DM may be disposed on the protective film PF. The display module DM may include a display panel DP and an input sensing unit ISP. The display panel DP may display the image in response to electrical signals and may transmit/receive information about the external input. The input sensing unit ISP may obtain coordinate information about the user input TC (refer to FIG. 1).

The display panel DP may be disposed on the protective film PF. The display panel DP may include an active area AA and a peripheral area NAA. The active area AA may be defined as an area through which the image IM (refer to FIG. 1) provided from the display module DM transmits. The peripheral area NAA may be defined adjacent to the active area AA. For example, the peripheral area NAA may surround the active area AA. However, this is merely an example, and the peripheral area NAA may be defined in various shapes and should not be particularly limited. According to an embodiment, the active area AA of the display panel DP may correspond to the display area DA.

The display panel DP may be a flexible display panel. The display panel DP may be a light emitting type display panel, however, it should not be particularly limited. For instance, the display panel DP may be an organic light emitting display panel or a quantum dot light emitting display panel.

A light emitting layer of the organic light emitting display panel may include an organic light emitting material. A light emitting layer of the quantum dot light emitting display panel may include a quantum dot or a quantum rod. Hereinafter, the organic light emitting display panel will be described as a representative example of the display panel DP.

The input sensing unit ISP may be disposed directly on the display panel DP. According to an embodiment, the input sensing unit ISP may be formed on the display panel DP through successive processes. When the input sensing unit ISP is disposed directly on the display panel DP as shown in FIG. 4, an adhesive film may not be disposed between the input sensing unit ISP and the display panel DP, however, the present disclosure should not be limited thereto or thereby. According to an embodiment, the adhesive film (not shown) may be disposed between the input sensing unit ISP and the display panel DP, which are provided in a panel form. In this case, the input sensing unit ISP may not be manufactured together with the display panel DP through the successive processes. That is, the input sensing unit ISP may be fixed to an upper surface of the display panel DP by the adhesive film (not shown) after being manufactured through a separate process from the display panel DP.

The anti-reflective layer RPL may be disposed on the input sensing unit ISP of the display module DM. Although not shown in FIG. 4, an adhesive film (not shown) that fixes the anti-reflective layer RPL to the input sensing unit ISP may be further disposed between the input sensing unit ISP and the anti-reflective layer RPL.

The anti-reflective layer RPL may block the reflection of an external light. The anti-reflective layer RPL may prevent components included in the display panel DP from being perceived from the outside due to the external light incident through the front surface of the display device DD.

The anti-reflective layer RPL may include a retarder and a polarizer. The retarder may be a film type or liquid crystal coating type and may include a λ/2 retarder and/or a λ/4 retarder. The polarizer may be a film type or liquid crystal coating type. The film type retarder and polarizer may include a stretching type synthetic resin film, and the liquid crystal coating type retarder and polarizer may include liquid crystals aligned in a predetermined alignment. The retarder and the polarizer may be implemented as one polarizing film.

The anti-reflective layer RPL may include color filters (not shown). The color filters may be arranged in a predetermined arrangement. The arrangement of the color filters may be determined by taking into account colors of lights emitted from pixels included in the display panel DP. In addition, the anti-reflective layer RPL may further include a black matrix (not shown) adjacent to the color filters.

According to an embodiment, the anti-reflective layer RPL may include a destructive interference structure. For instance, the destructive interference structure may include a first reflection layer and a second reflection layer, which are disposed on different layers from each other. A first reflection light and a second reflection light, which are reflected by the first reflection layer and the second reflection layer, respectively, may be destructively interfered, and thus, the anti-reflective layer RPL may reduce the reflectance with respect to the external light.

The adhesive layer ADL may be disposed between the anti-reflective layer RPL and the window WM, and the anti-reflective layer RPL may be attached to the window WM by the adhesive layer ADL. The adhesive layer ADL may include an optically clear adhesive ("OCA") film. However, the adhesive layer ADL should not be limited thereto or thereby and may include a conventional adhesive. For example, the adhesive layer ADL may include an optically clear resin ("OCR") or a pressure sensitive adhesive film ("PSA").

The window WM may be disposed on the anti-reflective layer RPL. The window WM may include an optically transparent insulating material. Therefore, the user may easily perceive the image IM (refer to FIG. 1) generated by the display module DM through the window WM.

The window WM may include a glass, tempered glass, or synthetic resin film as its base layer and may include functional layers disposed on an upper surface and/or a lower surface of the base layer. The window WM may be a glass substrate that is chemically tempered. In the case where the window WM is the chemically tempered glass substrate, the window WM may have a high mechanical strength while having a thin thickness, and thus, the window WM may be used as a window of a foldable display device.

The window WM may be folded or unfolded with respect to the first folding axis FX1. That is, when the shape of the display module DM is changed, the shape of the window WM may be changed.

The window WM may transmit the image from the display module DM and may substantially simultaneously buffer external impacts to prevent the display module DM from being damaged or malfunctioning due to the external impacts. The external impacts indicate an external force, such as pressure or stress, which causes defects in the display module DM.

The protective member WP may be disposed on the window WM. The protective member WP may improve an impact resistance of the window WM and may prevent the display device DD from shattering when damaged. The protective member WP may include at least one of a urethane-based resin, an epoxy-based resin, a polyester-based resin, a polyether-based resin, an acrylate-based resin, an acrylonitrile-butadiene-styrene ("ABS") resin, and a rubber. As an example, the protective member WP may include at least one of phenylene, polyethylene terephthalate ("PET"), polyimide ("PI"), polyamide ("PA"), polyethylene naphthalate ("PEN"), and polycarbonate ("PC").

FIGS. 4 and 5 show the display device DD folded with respect to the first folding axis FX1 as a representative example, however, the present disclosure should not be limited thereto or thereby. As an example, details of components of the display device DD that is folded with respect to the second folding axis FX1-1 are the same as those of the display device DD that is folded with respect to the first folding axis FX1.

Figure 6:
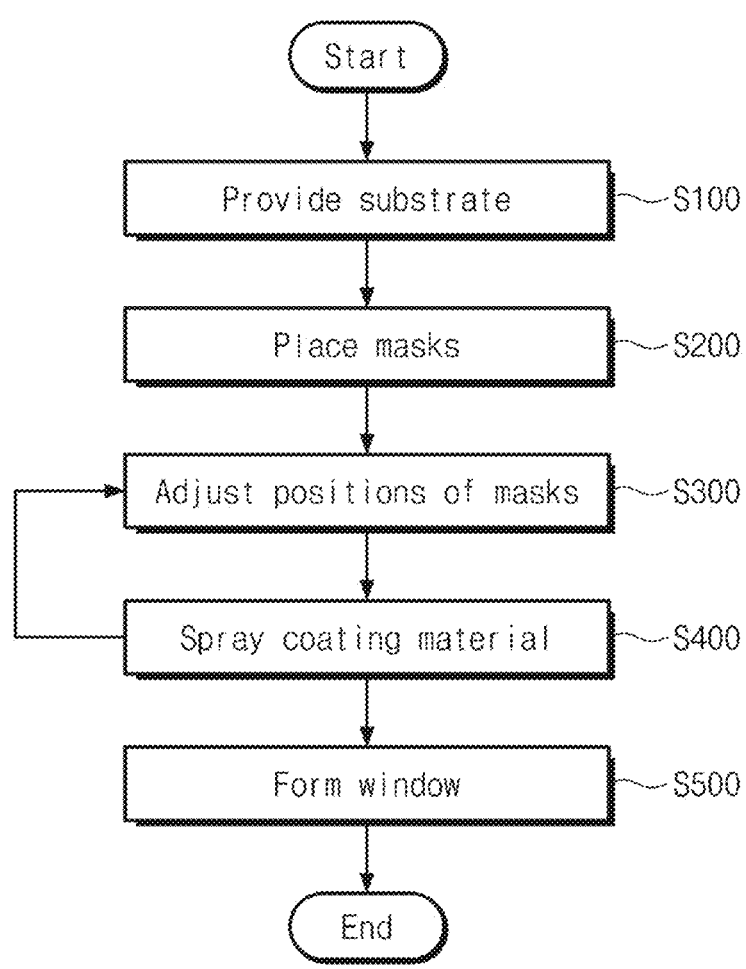
FIG. 6 is a flowchart of a method of manufacturing a display device according to an embodiment of the present disclosure.

FIG. 6 is a flowchart of a method of manufacturing the display device according to an embodiment of the present disclosure.

Referring to FIG. 6, the manufacturing method of the display device includes: providing a substrate (S100), placing a plurality of masks above the substrate (S200), adjusting positions of the masks (S300), spraying a coating material (S400), and heat-treating the coating material to form the window (S500).

Figure 7:
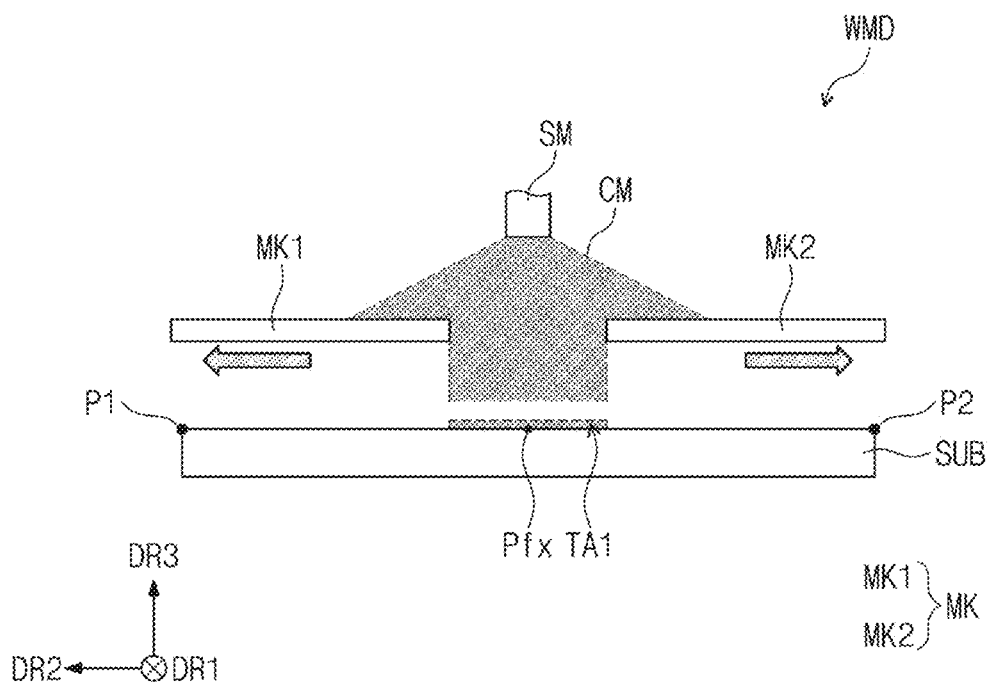
FIGS. 7 and 8 are cross-sectional views of some processes of a method of manufacturing a display device according to an embodiment of the present disclosure.
Figure 8:
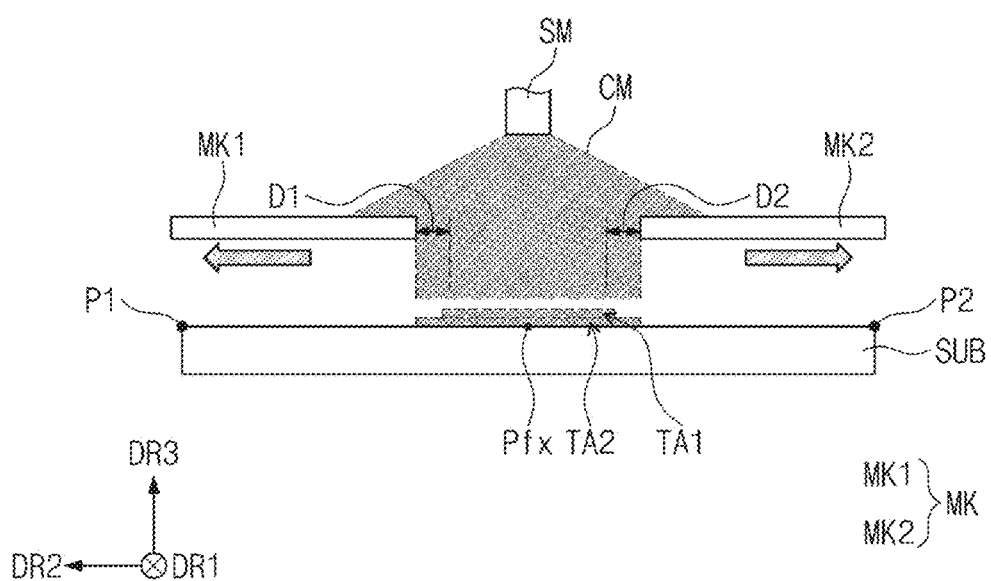
Figure 9:
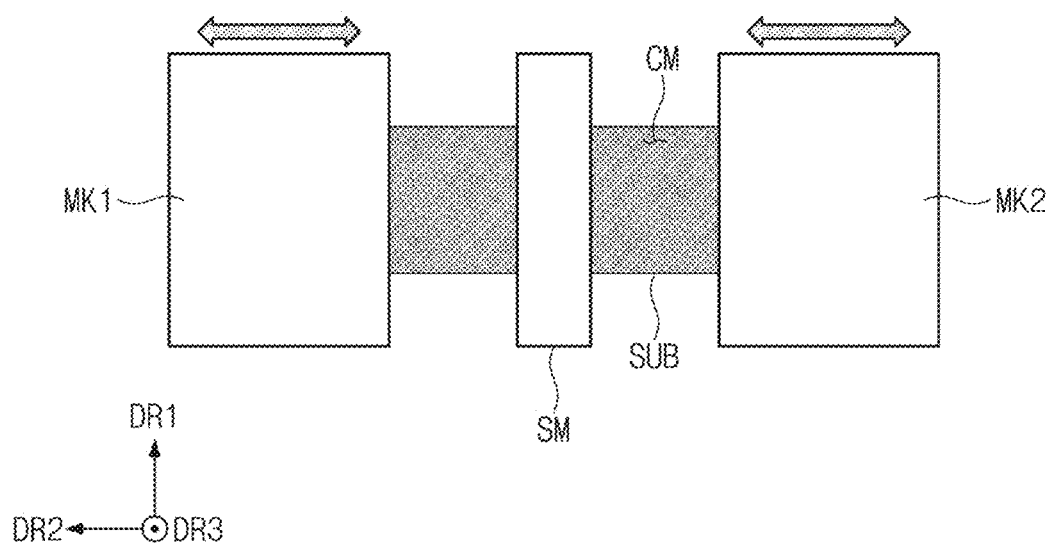
FIG. 9 is a plan view of a process of a method of manufacturing a display device according to an embodiment of the present disclosure.

FIGS. 7 and 8 are cross-sectional views of some processes of the manufacturing method of the display device according to an embodiment of the present disclosure. FIG. 9 is a plan view of a process of the manufacturing method of the display device according to an embodiment of the present disclosure.

Referring to FIGS. 6, 7, and 9, the substrate SUB may be provided in a window manufacturing device WMD (S100).

The substrate SUB may be, but not limited to, a glass substrate. The substrate SUB may become the window WM after the manufacturing process.

The window manufacturing device WMD may include a spray module SM and the masks MK. The spray module SM may spray the coating material CM, and the masks MK may adjust a target area TA1 or TA2 to which the coating material CM is sprayed.

The coating material CM may include a reinforcing agent, a solvent, and a binder. As an example, the reinforcing agent may be $KNO_3$, and the solvent may be a deionized water and may be a material that helps to enable coating. The binder may be a metal oxide powder. The binder may perform a function to keep the reinforcing agent on a surface of the substrate SUB.

The masks MK may be disposed above the substrate SUB (S200). The positions of the masks MK may be adjusted to expose the target area TA1 or TA2 of the substrate SUB (S300), and the spray module SM may spray the coating material CM to the substrate SUB (S400). As an example, when the spray module SM sprays the coating material CM to the substrate SUB, the coating material CM may be sprayed to an area of the substrate SUB, which overlaps the masks MK, and an area of the substrate SUB, which does not overlap the masks MK in a plan view. The coating material CM sprayed to the area of the substrate SUB, which overlaps the masks MK, may be blocked by the masks MK and may not be sprayed to the substrate SUB. The coating material CM sprayed to the area of the substrate SUB, which does not overlap the masks MK in a plan view, may be sprayed to the target area TA1 or TA2 of the substrate SUB. Accordingly, the target area TA1 or TA2 to which the coating material CM is sprayed may be controlled by adjusting the positions of the masks MK.

The adjusting of the positions of the masks (S300) and the spraying of the coating material CM (S400) may be substantially simultaneously performed. As an example, the masks MK may move continuously during the spraying of the coating material CM in the adjusting of the positions of the masks (S300). That is, a quantity of the coating material CM sprayed to the substrate SUB may be distributed continuously (i.e., distributed uniformly) rather than being distributed discontinuously. Accordingly, stains, which are caused by a sudden change in the quantity of the coating material CM, may be prevented from occurring on the substrate SUB, and thus, a visibility of the display device DD may be effectively improved.

Referring to FIGS. 7 and 8, the adjusting of the positions of the masks (S300) may include adjusting the positions of the masks MK to allow a first target area TA1 of the substrate SUB to be exposed and adjusting the positions of the masks MK to allow a second target area TA2 of the substrate SUB to be exposed. A size of the second target area TA2 may be greater than a size of the first target area TA1. That is, the second target area TA2 may include the first target area TA1 in a plan view. Since the coating material CM is sprayed during the adjusting of the positions of the masks MK, an amount of the coating material CM per unit area sprayed to the first target area TA1 may be greater than an amount of the coating material CM per unit area sprayed to the second target area TA2.

The masks MK may include a first mask MK1 and a second mask MK2. The first mask MK1 and the second mask MK2 may move to allow the first mask MK1 and the second mask MK2 to be away from each other. As an example, the first mask MK1 and the second mask MK2 may move in a direction parallel to the second direction DR2. The first mask MK1 may move in the second direction DR2, and the second mask MK2 may move in a direction opposite to the second direction DR2. A movement distance D1 of the first mask MK1 may be substantially the same as a movement distance D2 of the second mask MK2. Accordingly, the coating material CM may be sprayed symmetrically with respect to a center point Pfx of the substrate SUB. The center point Pfx of the substrate SUB may correspond to a center of the substrate SUB overlapping the first folding axis FX1 (refer to FIG. 10).

The amount of the coating material CM per unit area sprayed to the substrate SUB may be reduced as a distance from the center point Pfx increases. As an example, the amount of the sprayed coating material CM per unit area may be reduced as from the center point Pfx toward a first point P1 which is one end of the substrate SUB. In addition, the amount of the sprayed coating material CM per unit area may be reduced as from the center point Pfx toward second point P2 which is the other end of the substrate SUB.

FIGS. 7 and 8 show the first mask MK1 and the second mask MK2 which move away from each other; however, the present disclosure should not be limited thereto or thereby. As another example, the first mask MK1 and the second mask MK2 may move to allow the first mask MK1 and the second mask MK2 to be close to each other. The first mask MK1 and the second mask MK2 may move in the direction parallel to the second direction DR2. In this case, the first mask MK1 may move in the direction opposite to the second direction DR2, and the second mask MK2 may move in the second direction DR2. The movement distance D1 of the first mask MK1 may be substantially the same as the movement distance D2 of the second mask MK2, and the coating material CM may be sprayed symmetrically with respect to the center point Pfx of the substrate SUB. In addition, the amount of the sprayed coating material CM per unit area may be reduced as the distance from the center point Pfx increases.

The adjusting of the positions of the masks (S300) may include controlling movement speeds of the masks MK. As an example, the movement speeds of the first mask MK1 and the second mask MK2 may be controlled. When the movement speeds of the first mask MK1 and the second mask MK2 are fast, a difference in amount between the coating material CM per unit area sprayed to the center point Pfx and the coating material CM per unit area sprayed to each of the first and second points P1 and P2 may be reduced. That is, when the movement speeds of the first mask MK1 and the second mask MK2 are fast, the difference in amount of the coating material CM per unit area sprayed to the substrate SUB may be smaller than the difference in amount of the coating material CM per unit area sprayed to the substrate SUB when the movement speeds of the first mask MK1 and second mask MK2 are slow.

According to the present disclosure, the amount of the coating material CM per unit area sprayed to the substrate SUB may be controlled by controlling the movement speeds of the first mask MK1 and the second mask MK2, and thus, a surface compressive stress value of the window WM, which is changed depending on the amount of the coating material CM per unit area, may be controlled. As an example, the surface compressive stress value of the folding area FA may be controlled to increase. Accordingly, a folding reliability of the window WM may be effectively improved.

FIGS. 7 to 9 show two masks as a representative example, however, the number of the masks MK should not be limited thereto or thereby. As an example, the number of masks MK may vary depending on characteristics of the window WM to be strengthened.

Referring to FIGS. 6 and 7, after the spraying of the coating material CM, the window manufacturing device WMD may heat-treat the substrate SUB and the coating material CM sprayed to the substrate SUB to form the window WM (refer to FIG. 4) (S500). When the window WM is formed, an ion exchange may occur within the window WM. As an example, Na+ ions in the substrate SUB may be replaced with K+ ions, and thus, the surface compressive stress value and strength of the window WM may be improved. A temperature at which the ion exchange occurs between the substrate SUB and the coating material CM may be equal to or greater than about 370 degrees in Celsius (° C.) and equal to or smaller than about 420 degrees in Celsius.

Figure 10:
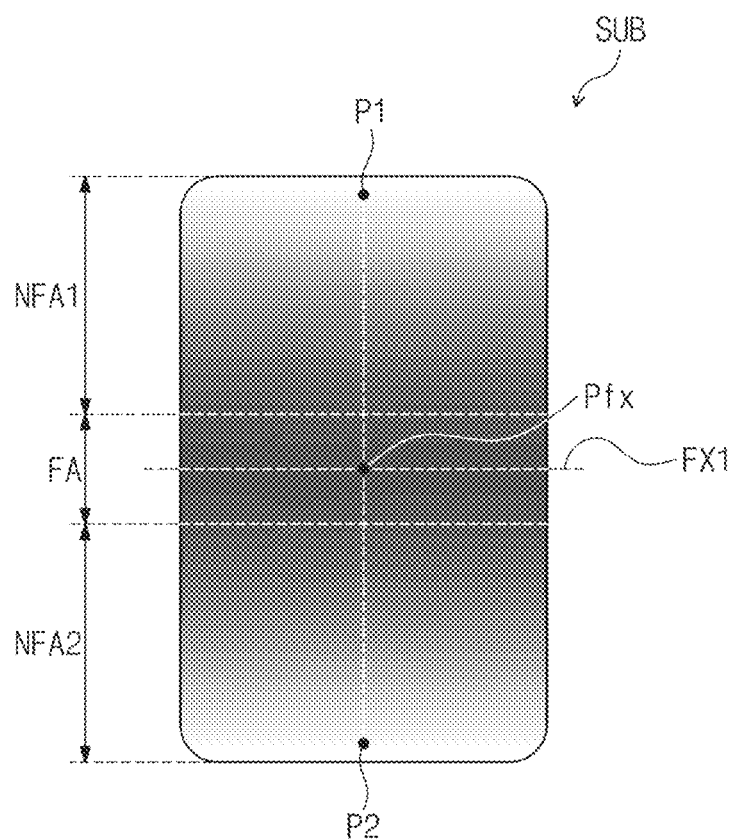
FIG. 10 is a plan view of a substrate according to an embodiment of the present disclosure.

FIG. 10 is a plan view of the substrate SUB according to an embodiment of the present disclosure. FIG. 10 shows the substrate SUB to which the coating material CM is sprayed.

Referring to FIG. 10, the substrate SUB may include the first non-folding area NFA1, the folding area FA adjacent to the first non-folding area NFA1, and the second non-folding area NFA2 adjacent to the folding area FA. The substrate SUB may be folded or unfolded with respect to the first folding axis FX1 of the substrate SUB, which extends in the first direction DR1. The coating material CM per unit area sprayed to the folding area FA of the substrate SUB may have the thickness greater than the thickness of the coating material CM per unit area sprayed to the first and second non-folding areas NFA1 and NFA2. In addition, the amount of the sprayed coating material CM per unit area may be reduced as a distance from the first folding axis FX1 in the second direction DR2 increases.

Figure 11A:
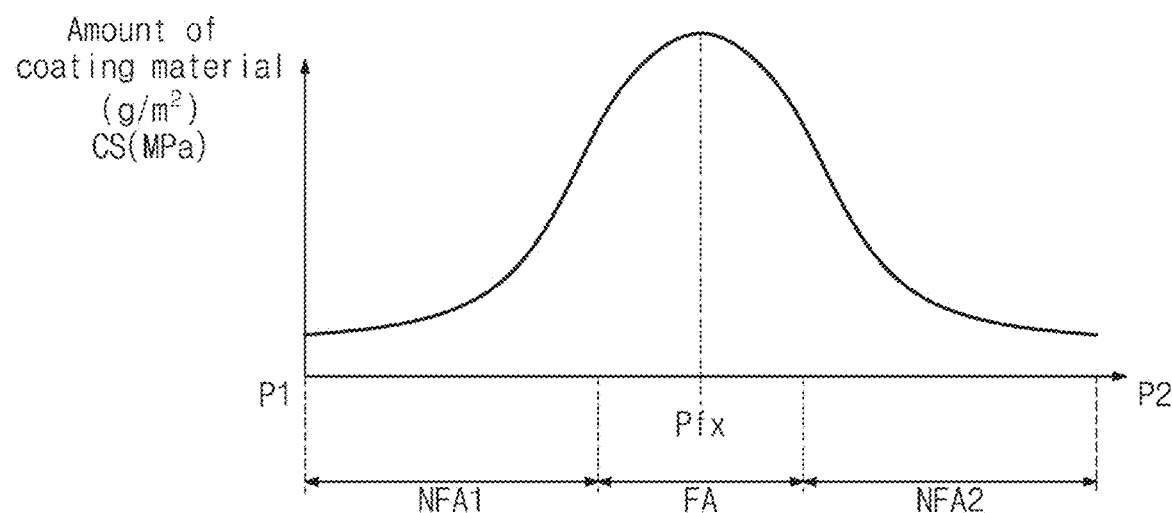
FIG. 11A is a graph of an amount of a coating material per unit area and a surface compressive stress value according to a position in a window.

FIG. 11A is a graph of an amount of the coating material CM per unit area (unit: gram per square meters) and the surface compressive stress value CS (unit: megapascal) according to a location in the window WM (refer to FIG. 4).

Referring to FIGS. 4, 10, and 11A, the substrate SUB may be a preliminary window. That is, the window WM may be folded or unfolded with respect to the first folding axis FX1 extending in the first direction DR1. The surface compressive stress value CS of the window WM may be continuously reduced as a distance from the first folding axis FX1 in the second direction DR2 increases. The surface compressive stress value CS denotes a force vertically applied on an area of cross-section of an object to which a compression stress is applied. The surface compressive stress value CS of the window WM may vary depending on the amount of the sprayed coating material CM per unit area. The surface compressive stress value CS of the window WM may be high in an area where the coating material CM is sprayed a lot, and the surface compressive stress value CS of the window WM may be low in an area where the coating material CM is sprayed less.

According to the present disclosure, as the movement of the first mask MK1 and the second mask MK2 are controlled, the coating material CM sprayed to the substrate SUB may be continuously distributed, and the surface compressive stress value CS of the window WM may have continuity. That is, as the amount of the coating material CM per unit area is continuously reduced as the distance from the center point Pfx of the substrate SUB increases, the surface compressive stress value CS may be continuously reduced as the distance from the center point Pfx of the window WM increases. Accordingly, stains caused by the discontinuous distribution of the coating material CM may be prevented, and the visibility of the display device DD may be improved.

In addition, as the movement speeds of the first mask MK1 and the second mask MK2 are controlled, a slope of the graph shown in FIG. 11A may be adjusted. That is, the amount of the coating material CM per unit area sprayed to the substrate SUB may be controlled, and the slope of the surface compressive stress value CS of the window WM may be adjusted. Accordingly, the stains caused by the difference in amount of the coating material CM per unit area according to the areas of the window WM may be prevented, and the visibility of the display device DD may be improved.

Figure 11B:
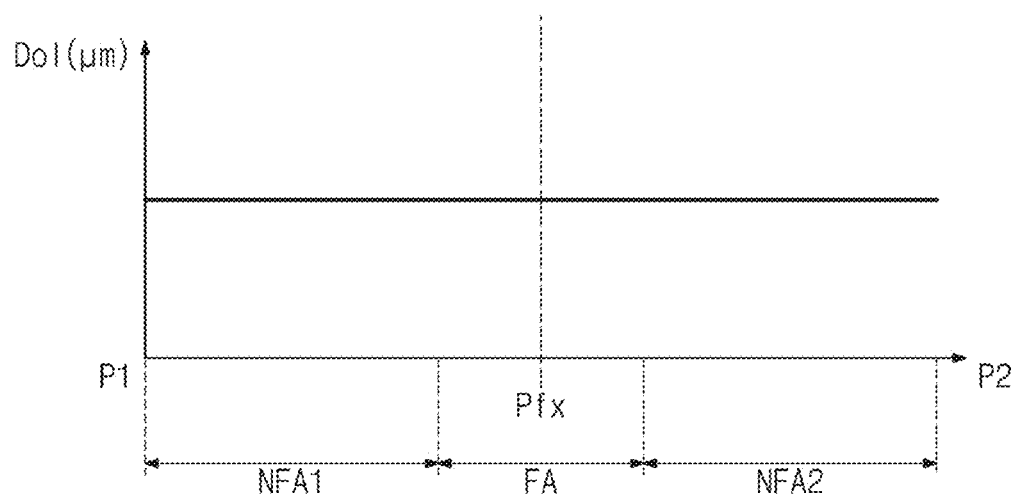
FIG. 11B is a graph of a compressive stress depth according to a position in of the window.

FIG. 11B is a graph of a compressive stress depth Dol according to a position in the window WM (refer to FIG. 4).

Referring to FIGS. 4, 10, and 11B, the compressive stress depth Dol of the window WM may be uniform regardless of a position in the window WM. The compressive stress depth Dol may indicate a depth (unit: micrometer) of the window WM at a point where the surface compressive stress value CS is zero (0). The amount of the coating material CM per unit area may be in proportion to the surface compressive stress value CS, however, may be independent of the compressive stress depth Dol. On the other hand, the compressive stress depth Dol may be in proportion to a strength of the window WM. That is, the strength of the window WM manufactured by controlling the amount of the coating material CM per unit area may be uniform while the surface compressive stress value CS increases as a distance from the center point Pfx decreases.

Figure 12:
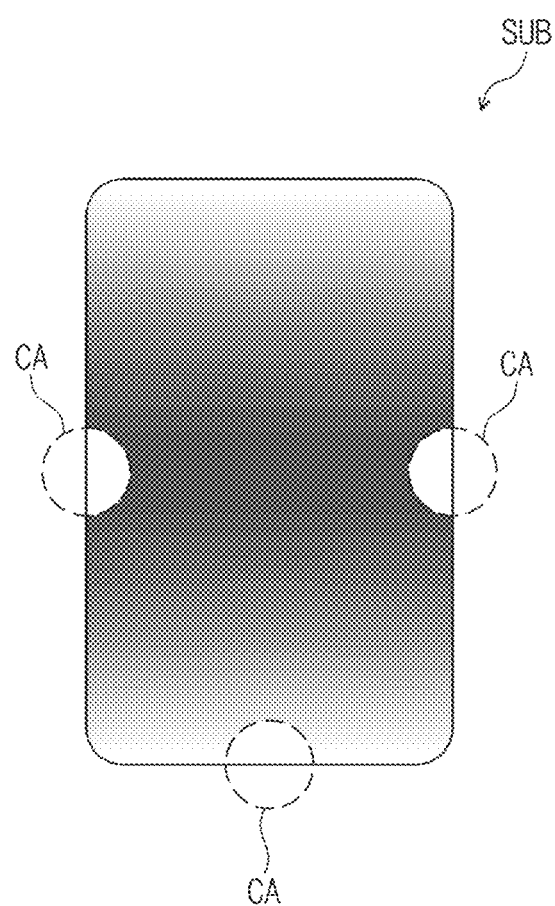
FIG. 12 is a plan view of a substrate according to an embodiment of the present disclosure.

FIG. 12 is a plan view of the substrate SUB according to an embodiment of the present disclosure.

Referring to FIGS. 6 and 12, the adjusting of the positions of the masks (S300) may include moving the masks to cover a contact area CA. As a result, the coating material CM (refer to FIG. 7) may not be sprayed to the contact area CA.

The contact area CA may be defined as an area where the substrate SUB and a jig are in contact with each other when the substrate SUB is strengthened, e.g., the substrate SUB is wet strengthened. The contact area CA may be located at an edge portion of the substrate SUB. The coating material CM may be a salt. As the coating material CM is not sprayed to the contact area CA, the coating material CM may not be present between the jig and substrate SUB. Accordingly, defects caused when the salt is present between the jig and the substrate SUB may be prevented, and deterioration in visibility of the display device DD (refer to FIG. 1) due to residual salt may be effectively prevented.

As the defects caused when the salt is present between the jig and the substrate SUB, there are a crack defect of the substrate SUB caused by solidification of the coating material CM on the surface and a bottom portion of the substrate SUB, a dent defect of the substrate SUB caused by the solidification of the coating material CM in the contact area CA, and a stacking defect caused by non-uniform stress occurring in the substrate SUB.

According to the present disclosure, the coating material CM may not be sprayed to the contact area CA defined in the substrate SUB. Accordingly, defects caused when the coating material CM is sprayed to the contact area CA may not be generated, and thus, a manufacturing yield and a product reliability of the window WM (refer to FIG. 4) may be improved.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present invention shall be determined according to the attached claims.

What is claimed is:

1. A method of manufacturing a window, comprising:
providing a substrate;
placing a plurality of masks above the substrate;
adjusting positions of the plurality of masks to expose a target area of the substrate;
spraying a coating material towards the target area of the substrate exposed by the plurality of masks; and
heat-treating the substrate and the coating material sprayed on the substrate to form the window,
wherein:
the substrate comprises a first non-folding area, a second non-folding area and a folding area therebetween and is foldable about a folding axis of the folding area,
the plurality of masks comprise a first mask and a second mask, and
the adjusting of the positions of the plurality of masks comprises moving the first and second masks continuously with respect to one another about the folding axis during the spraying of the coating material.

2. The method of claim 1, wherein the target area includes a first target area and a second target area,
wherein the adjusting of the positions of the plurality of masks comprises:
adjusting the positions of the plurality of masks to expose the first target area of the substrate; and
adjusting the positions of the plurality of masks to expose the second target area greater than the first target area of the substrate.

3. The method of claim 2, wherein the second target area comprises the first target area.

4. The method of claim 1, wherein the
adjusting of the positions of the plurality of masks comprises moving the first and second masks such that the first and second masks move away from each other and the spraying of the coating material comprises symmetrical spraying with respect to a center point of the substrate.

5. The method of claim 4, wherein a movement distance of the first mask is equal to a movement distance of the second mask.

6. The method of claim 1, wherein the adjusting of the positions of the plurality of masks comprises controlling movement speeds of the plurality of masks.

7. The method of claim 1, wherein the adjusting of the positions of the plurality of masks comprises moving the plurality of masks continuously during the spraying of the coating material and the spraying of the coating material comprises symmetrical spraying with respect to a center point of the substrate.

8. The method of claim 1, wherein the
adjusting of the positions of the plurality of masks comprises moving the first and second masks such that the first and second masks get close to each other and the spraying of the coating material comprises symmetrical spraying with respect to a center point of the substrate.

9. The method of claim 1, wherein the
coating material sprayed to the folding area has a thickness greater than a thickness of the coating material sprayed to the first and second non-folding areas.

10. The method of claim 1, wherein the folding axis extends in a first direction, and an amount of the sprayed coating material per unit area is reduced as a distance from the folding axis in a second direction perpendicular to the first direction increases.

11. The method of claim 1, wherein the forming of the window comprises exchanging an ion in the window.

12. The method of claim 1, wherein the adjusting of the positions of the plurality of masks comprises moving the plurality of masks to cover a contact area of the substrate.

13. The method of claim 1, wherein:
the coating material comprises a reinforcement agent comprising potassium nitrate ($KNO_3$), a solvent comprising deionized water and a binder comprising a metal oxide powder, and
an amount of the coating material sprayed towards the target area of the substrate has a bell-curve shape relative to a center point of the substrate.

14. A method of manufacturing a window, comprising:
providing a substrate comprising a first non-folding area, a second non-folding area, and a folding area therebetween; and
spraying a coating material to the substrate, wherein the coating material sprayed to the folding area has a thickness greater than a thickness of the coating material sprayed to the first and second non-folding areas,
wherein:
the substrate is foldable about a folding axis of the folding area, and
the method further comprises moving first and second masks continuously with respect to one another about the folding axis during the spraying of the coating material.

15. The method of claim 14, further comprising adjusting positions of the first and second masks to expose a target area of the substrate,
wherein the adjusting of the positions of the first and second masks comprises:
adjusting the positions of the first and second masks to expose a first target area of the substrate; and
adjusting the positions of the first and second masks to expose a second target area greater than the first target area of the substrate,
wherein the target area includes the first and second target areas.

16. The method of claim 15, wherein the
moving of the first and second masks is such that the first and second masks are moved away from each other and the spraying of the coating material comprises symmetrical spraying with respect to a center point of the substrate.

17. The method of claim 16, wherein a movement distance of the first mask is equal to a movement distance of the second mask.

18. The method of claim 15, wherein the adjusting of the positions of the first and second masks comprises controlling movement speeds of the first and second masks.

* * * * *